(12) United States Patent
Pollack et al.

(10) Patent No.: US 8,092,607 B2
(45) Date of Patent: Jan. 10, 2012

(54) TRANSPORTING MEANS AND VACUUM COATING INSTALLATION FOR SUBSTRATES OF DIFFERENT SIZES

(75) Inventors: Gerd Pollack, Coswig (DE); Andrej Wolf, Dresden (DE); Matthias Klooss, Dresden (DE); Johannes Struempfel, Dresden (DE)

(73) Assignee: Von Ardenne Anlagentechnik GmbH, Dresden (DE)

( * ) Notice: Subject to any disclaimer, the term of this patent is extended or adjusted under 35 U.S.C. 154(b) by 497 days.

(21) Appl. No.: 12/262,434

(22) Filed: Oct. 31, 2008

(65) Prior Publication Data

US 2009/0114159 A1    May 7, 2009

(30) Foreign Application Priority Data

Nov. 1, 2007 (DE) .......................... 10 2007 052 524

(51) Int. Cl.
*C23C 14/50* (2006.01)
*C23C 14/00* (2006.01)
*B65G 13/02* (2006.01)
*B65G 13/00* (2006.01)
*C23C 16/00* (2006.01)

(52) U.S. Cl. .......... 118/729; 118/728; 118/50; 198/782; 193/35 B; 204/298.01; 204/298.23

(58) Field of Classification Search .............. 118/50, 118/728–729; 204/298.01, 298.23; 198/782; 193/35 B See application file for complete search history.

(56) References Cited

U.S. PATENT DOCUMENTS

| | | | |
|---|---|---|---|
| 4,194,962 A * | 3/1980 | Chambers et al. ....... | 204/298.23 |
| 4,765,273 A | 8/1988 | Anderle | |
| 4,971,336 A | 11/1990 | Ferguson | |
| 5,133,285 A * | 7/1992 | Mahler et al. ................. | 118/719 |
| 5,244,559 A * | 9/1993 | Latz .......................... | 204/298.09 |
| 5,538,610 A * | 7/1996 | Gesche et al. ........... | 204/298.15 |
| 6,309,525 B2 * | 10/2001 | Futagawa et al. ........ | 204/298.11 |
| 2006/0035021 A1 * | 2/2006 | Hartig .......................... | 427/209 |

FOREIGN PATENT DOCUMENTS

| | | |
|---|---|---|
| DE | 3134477 A1 | 4/1982 |
| DE | 3836474 A1 | 6/1989 |
| DE | 4125334 A1 | 2/1993 |
| DE | 4139549 A1 | 6/1993 |
| DE | 4303462 A1 | 10/1993 |
| DE | 3623970 A1 | 1/1998 |
| DE | 19735603 C1 | 11/1998 |
| DE | 10241847 A1 | 4/2003 |

* cited by examiner

*Primary Examiner* — Dah-Wei Yuan
*Assistant Examiner* — Stephen Kitt
(74) *Attorney, Agent, or Firm* — Heslin Rothenberg Farley & Mesiti P.C.

(57) ABSTRACT

In a vacuum coating installation to coat planar substrates, comprising a vacuum chamber and a transport device arranged in the vacuum chamber for transporting the substrates along a transportation path through the vacuum chamber, with the transport device comprising a multitude of transport rollers arranged successively along the transportation path, each transport roller is adapted to be mounted at least at two different positions, vertically distanced from each other. A carrier frame has a substrate accepting structure and a guiding rod arranged at the bottom of the carrier frame in the direction of transportation to create a friction connection with the transportation device, connected to the carrier frame at the connection points, with the guiding rod being connected at least at one connection point to the carrier frame such that a relative displacement is possible of the guiding rod relative to the carrier frame in the direction of transportation.

16 Claims, 8 Drawing Sheets

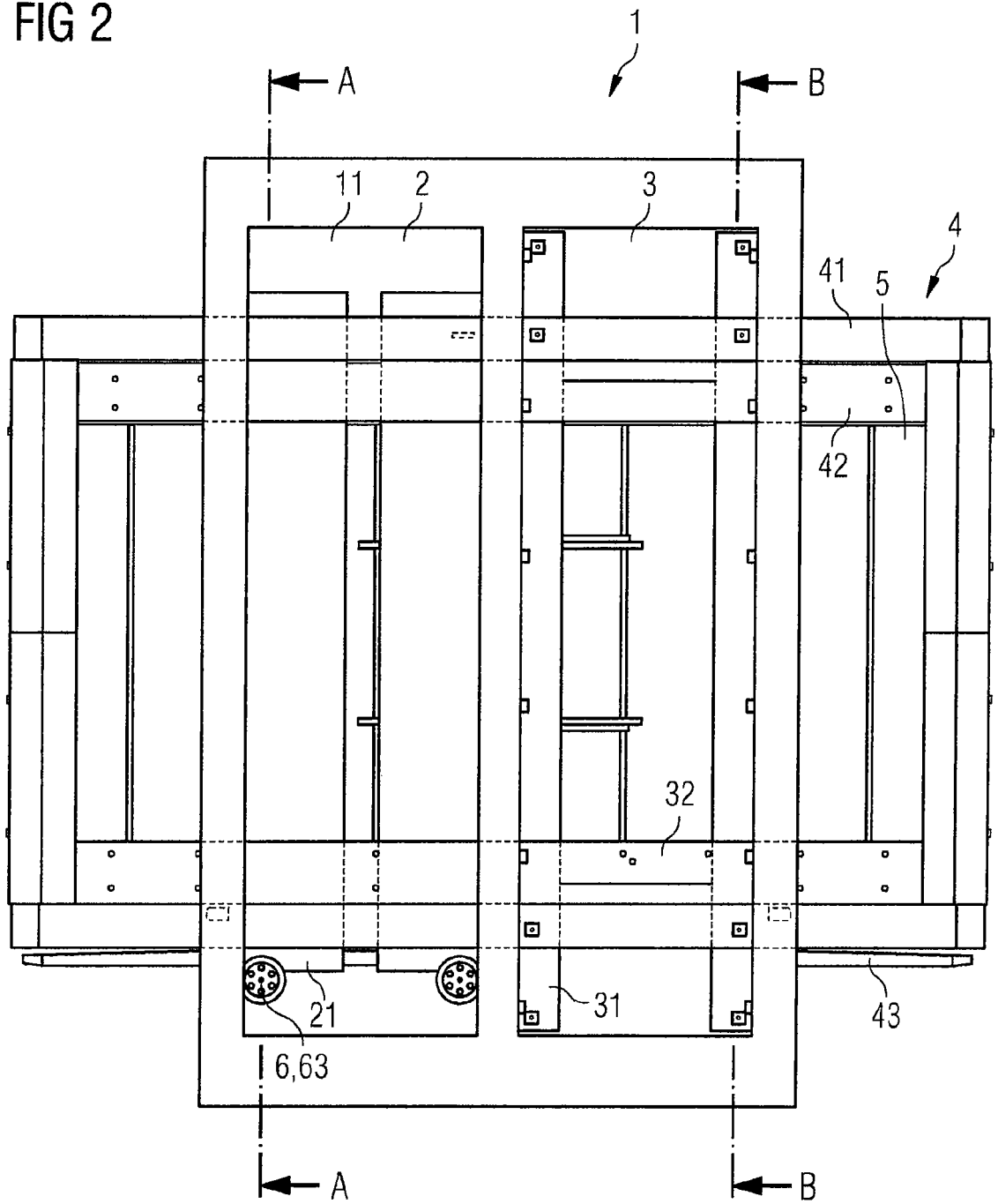

Figure 1:
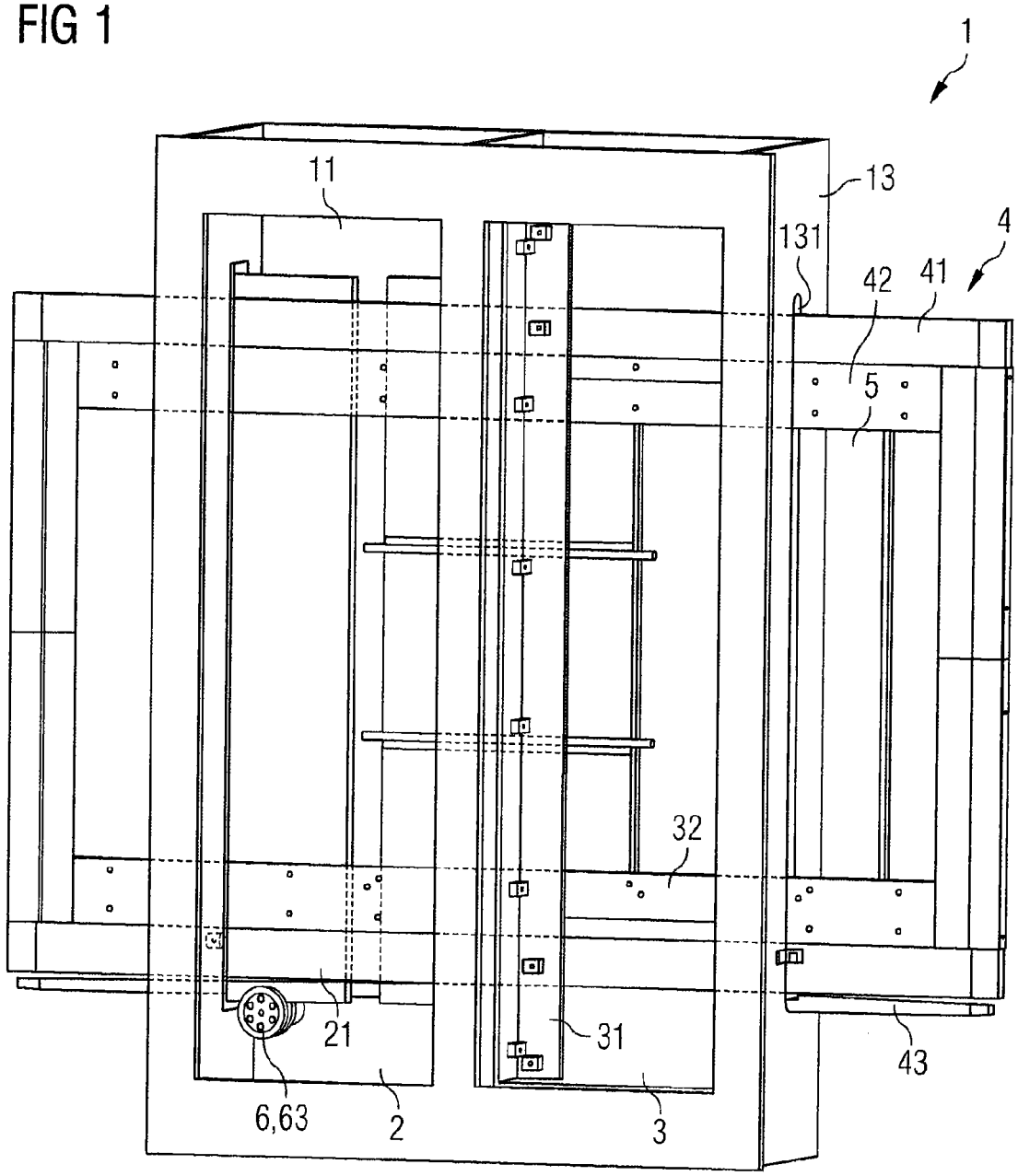

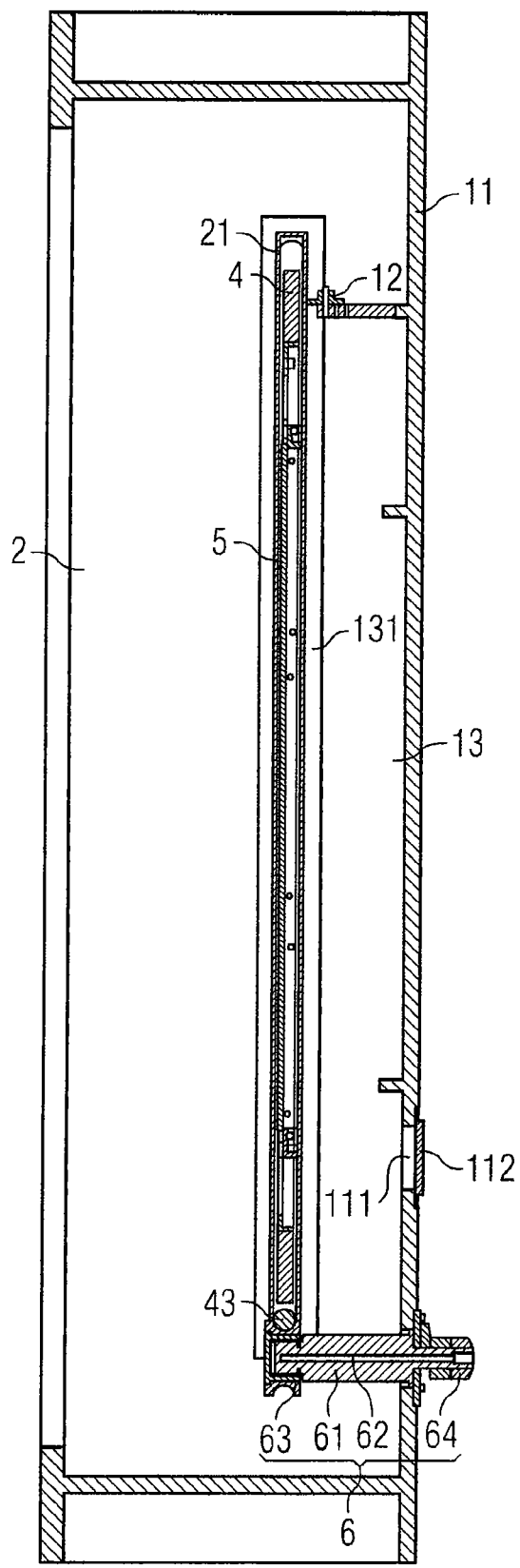
FIG 3  A-A

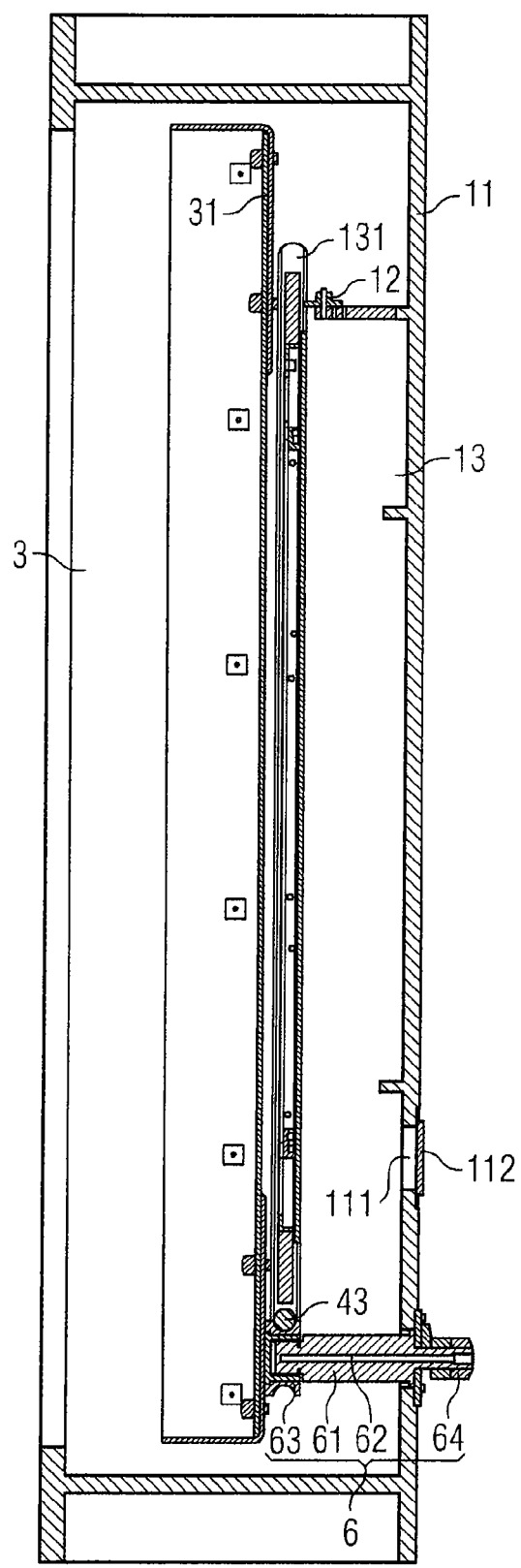
FIG 4  B-B

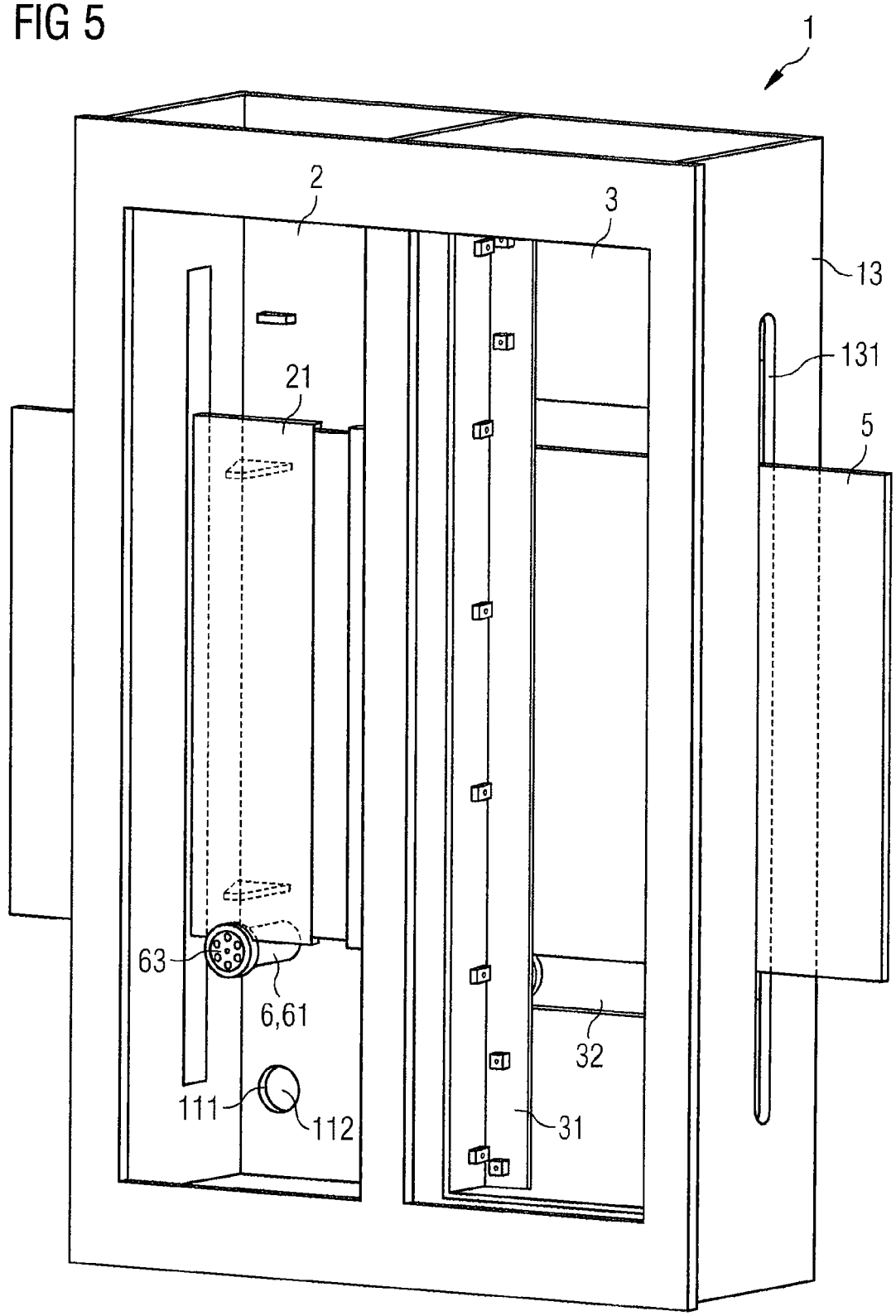

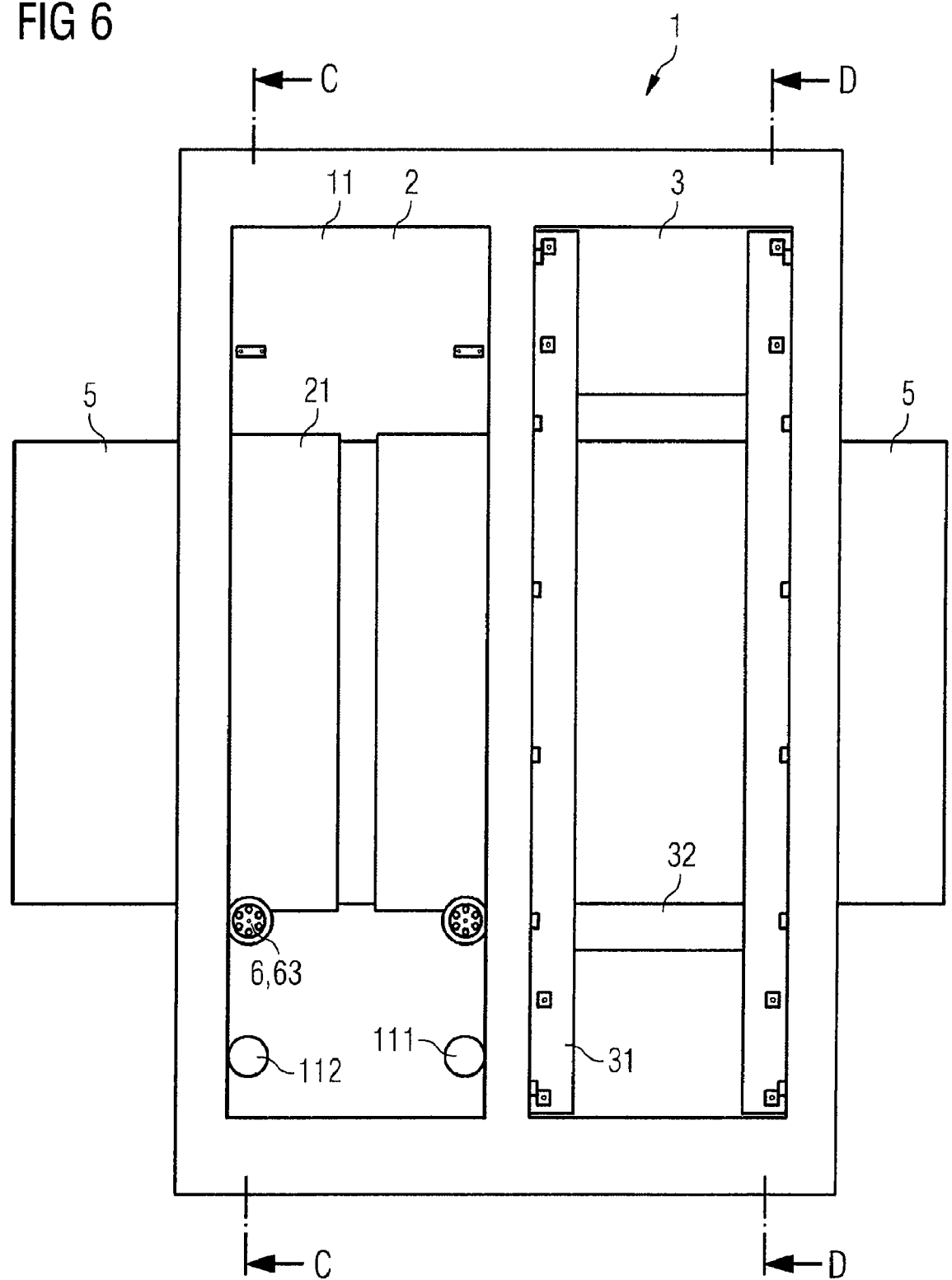

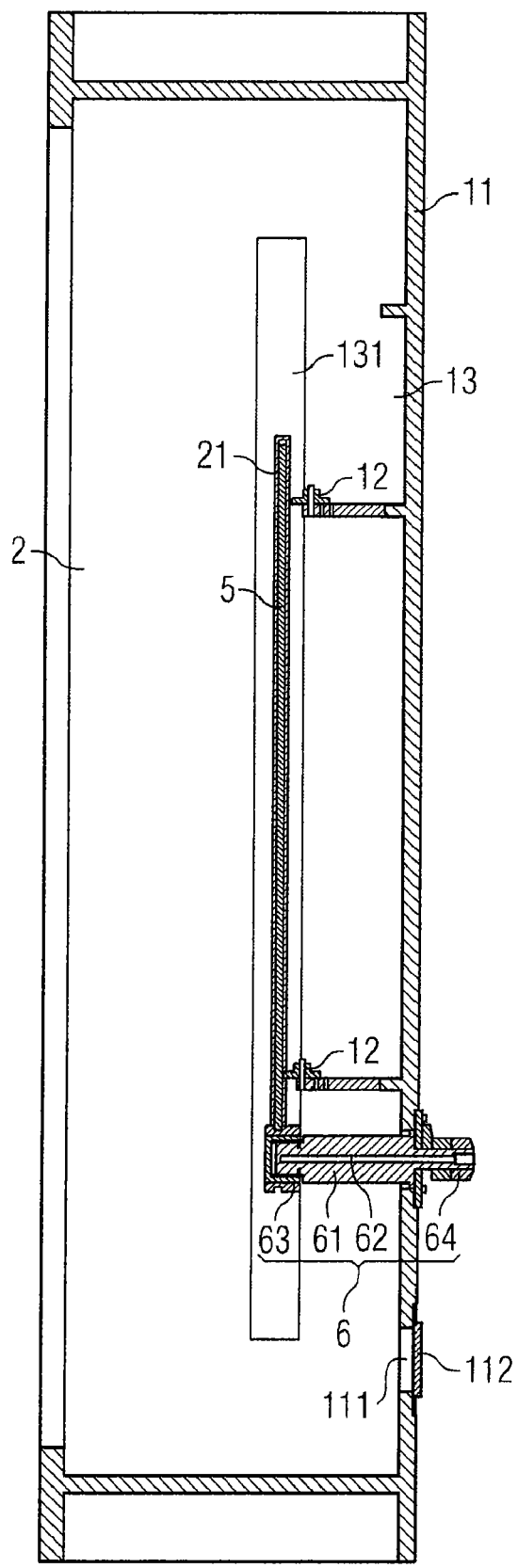
FIG 7   C-C

FIG 8   D-D
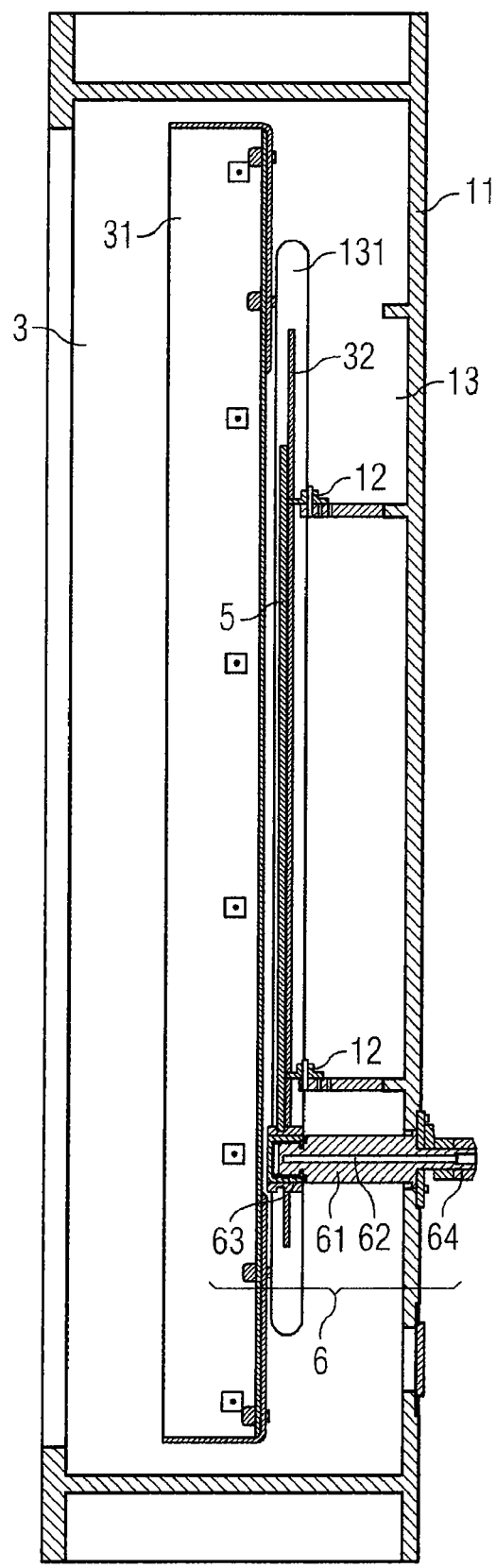

TRANSPORTING MEANS AND VACUUM COATING INSTALLATION FOR SUBSTRATES OF DIFFERENT SIZES

CROSS REFERENCE TO RELATED APPLICATIONS

This application claims priority of German application No. 10 2007 052 524.0 filed on Nov. 1, 2007, the entire disclosure of this application is being hereby incorporated herein by reference.

BACKGROUND ART

The invention relates to a transporting means and a vacuum coating installation for substrates of different sizes.

An important application for vacuum coating installations is the coating of planar substrates, for example glass panes, with thin layers, for example for the reflection of infrared radiation. Here, in principle, two types of installations are distinguished. In horizontal vacuum coating installations the substrates are transported through the vacuum chamber lying flat on a transporting device. Such transporting devices frequently comprise an arrangement of transport rollers, with at least some of them can be driven.

In vertical vacuum coating installations the substrates are transported through the vacuum chamber standing on a transporting device. Here, too, frequently transporting devices are used comprising an arrangement of transport rollers with some of them can be driven. The substrates either stand directly on the transporting rollers (carrier-less transportation) at an edge or they are held in a transportation frame (carrier), which in turn stands on the transporting roller. In both cases the substrates are either aligned precisely vertically or slightly tilted in reference to the vertical direction in order to achieve a stably balanced position.

Vertical vacuum coating installations are generally designed for coating a certain size of substrates. This means that the transporting device and the coating source are arranged inside the vacuum chamber and in reference to each other such that an optimal coating result is achieved for the intended substrate size. Due to this fact vertical vacuum coating installations of prior art are relatively inflexible with regard to the size of the substrates to be coated. Therefore there is a need for technical solutions allowing to coat substrates of different sizes optionally with or without any carriers, in a vertical vacuum coating installation.

BRIEF SUMMARY OF INVENTION

In the following a transport roller is suggested for a transportation device, a transporting means for a planar substrate, as well as a vacuum coating installation for coating planar substrates.

A transport roller is suggested for a transporting installation, in particular in a vacuum coating installation, comprising a spacer with a support wheel being provided at one of its ends, rotational around a rotary axis, and with its other end being embodied for fastening to a planar surface. The suggested transport roller allows the support and the transportation of a substrate upstream in reference to the surface at which the transport roller is mounted, for example a chamber wall of a vacuum coating installation. Here, it may be provided that the rotary axis of the support wheel is aligned diagonally or perpendicularly in reference to the surface the transport roller is mounted to.

In an embodiment it is suggested for the spacer to represent a shaft housing, in which one shaft is supported in a rotary fashion, projecting from the shaft housing at least at one side, and the support wheel being arranged on the end of the shaft projecting from the shaft housing. For example, at its end opposite the support wheel the spacer can provided with a flange having penetrating bores serving to fasten the spacer to a chamber wall of a vacuum coating installation. The shaft can be supported in roller bearings or friction bearings, for example, arranged in the shaft housing.

Further, it may be provided that the shaft also projects from the shaft housing at the end opposite the support wheel and that at this end of the shaft a drive wheel is arranged. This embodiment makes it possible to drive the transport roller, for example with the help of a driving device, with the driving device may be arranged outside the vacuum chamber. For this purpose, the drive wheel can be embodied such, for example, that its circumferential surface is embodied to cooperate with a toothed belt.

Alternatively it can be provided that the spacer is a base provided at least at one end with a stub shaft, and a support wheel being supported rotationally on the stub shaft. When instead of the shaft the support wheel is supported on a stub shaft an expensive support inside the shaft housing can be omitted. The spacer can be produced in one piece and the support wheel can be supported on the stub shaft, for example with a roller bearing or a friction bearing. This embodiment is particularly suitable for non-driven transport rollers.

In order to improve friction between the support wheel and the substrate or the transportation frame it may also be provided that the circumferential surface of the support wheel has a friction-enhancing surface. The friction-enhancing surface of the support wheel can represent a three-dimensionally structured surface for example, roughened for example by beading, or a friction-enhancing coating on the support wheel. A friction-enhancing coating may be for example a coating made from plastic. Further, it may be provided that the support wheels for guiding the substrates or the transportation frame are profiled. For this purpose, a circumferential groove may be provided at the support wheels, for example. The groove can be embodied V-shaped, for example.

Furthermore, a vacuum coating installation for coating planar substrates is suggested comprising a vacuum chamber and a transporting device arranged in the vacuum chamber to transport the substrates through the vacuum chamber along a transporting path, with the transporting device comprising a multitude of transport rollers of the above-mentioned type arranged successively along the transportation path, and with each transport roller mountable at least at two different positions, vertically distanced from each other.

In the suggested vacuum coating installation it may be provided that at least some of the transport rollers can be driven. The drive unit provided to drive the transport rollers can be arranged inside or outside the vacuum chamber. A drive unit arranged outside the vacuum chamber is advantageous to protect the drive unit from high temperatures and unintended coating.

Further, it can be provided that several transport rollers can be driven jointly by the very same drive units, for example a steel rope, a chain, or a toothed belt. When the driving device is arranged outside the vacuum chamber it may be provided that openings are provided in a wall of the vacuum chamber to mount the transport rollers such that the end of the shaft of the transport rollers that can be driven, opposite the support wheel, project from the vacuum chamber. In this case dummy covers can be provided to close openings not needed.

Furthermore, a transporting means for a planar substrate is suggested that comprises a carrier frame and accepting means for the substrate arranged at the carrier frame as well as a guiding rod arranged at the bottom of the carrier frame aligned in the direction of transportation to create friction towards a transporting device, with the guiding rod being connected to the transportation frame at the connection sites. Here, the guiding rods can be connected to the carrier frame at least at one connection point such that a relative displacement of the guiding rod in reference to the carrier frame is possible in the direction of transportation.

This way, temperature-related deformations of the carrier frame or the guiding rod can be easier compensated so that a secure transportation of the transport means through the vacuum chamber is ensured. The connection between the carrier frame and the guiding rod can be embodied in a displaceable fashion, for example, so that relative displacements of the guiding rod in reference to the carrier frame, for example due to different heat extensions of the carrier frame and the guiding rod, can be compensated or by the bending of the guiding rod caused by the self-weight of the carrier frame and the substrate.

In an embodiment it is provided that the guiding rod projects at least at one side of the carrier frame beyond the connection point to the carrier frame and that the part of the guiding rod projecting tapers towards its end. This way, the free end of the guiding rod can be deformed easier so that even in potentially occurring deformations of the guiding rod due to heat stress the guiding rod can enter the next transport roller without any problems and thus secure transportation of the transporting means through the vacuum chamber is ensured.

In order to allow the use of the transporting means to coat differently sized substrates it is further suggested to arrange the accepting means in the carrier frame variable with regard to their position in order to adjust to differently sized substrates.

BRIEF DESCRIPTION OF THE DRAWING FIGURES

In the following, the suggested vacuum coating installations with the variable transportation device and the suggested transporting means are explained in greater detail using an exemplary embodiment and corresponding figures. Shown here FIG. 1 a perspective view of a part of vertical vacuum coating installation, FIG. 2 the vacuum coating installation of FIG. 1 in a top view, FIG. 3 a first cross-section of the vacuum coating installation of FIG. 1, FIG. 4 a second cross-section of the vacuum coating installation of FIG. 1, FIG. 5 a perspective view of a part of a vertical vacuum coating installation, FIG. 6 the vacuum coating installation of FIG. 5 in a top view, FIG. 7 a first cross-section of the vacuum coating installation of FIG. 5, FIG. 8 a second cross-section of the vacuum coating installation of FIG. 5.

DETAILED DESCRIPTION

FIGS. 1 and 2 show a section of a vertical in-line vacuum coating installation in different views. Concretely, it relates to a gas separation or pump section 2 (left) and a sputter section 3 (right) in a common housing 1. The covers, usually located at the front, are not shown in order to allow a view into the section. A transporting means 4 for transporting planar substrates 5 is being moved through the two displayed sections 2, 3. For this purpose, the separating walls 13 arranged between the sections 2, 3 are provided with slot-shaped openings 131. The transporting means 4 comprises a carrier frame 41 with accepting means 42 for a substrate 5 and a guiding rod 43 mounted at the bottom of the carrier frame 41. The guiding rod 43 is supported on the support wheels 63 of transport rollers 6, which are mounted at the back 11 of the pump section 2 and are part of a transportation device.

In the area of a pump section 2 the substrate 5 is guided through a narrow tunnel 21, adjusted to the size of the transporting means 4, provided in the center with an opening in order to allow gas separation between adjacent sections. Additionally the tunnel 21 is provided at its bottom with recesses for the transport rollers 6. In the sputter section 3 blinds 31 are arranged in front of the transporting level of the substrate 5, releasing the area to be coated. Behind the transporting level of the substrate 5 a counter sputter level 32 is arranged, on which the coating material is collected passing between the blind 31 and the substrate 5. Additionally, the counter sputter level 32 has recesses for the transport rollers 6 arranged in the sputter section 3.

FIG. 3 shows a cross-section through the pump section 2 according to the intersection line A-A in FIG. 2. FIG. 4 shows a cross-section through the sputter section 3 according to the intersection line B-B in FIG. 2. In both sections 2, 3 horizontal support rollers 12 are provided in the upper section of the rear wall 11, supporting the transporting means 4 in the horizontal direction through openings in the tunnel 21 provided for that purpose.

Openings 111 are arranged in the lower section of the back wall 11 at two different heights. The transport rollers 6 are arranged in the lower openings 111, each already comprising a shaft housing 61 with a shaft 62 supported therein. A support wheel 63 is arranged at the end of the shaft 62 located inside the vacuum chamber, on which the guiding rod 43 of the transporting means 4 is guided. A drive wheel 64 is arranged at the end of the shaft 62 located outside the vacuum chamber, which serves to drive the transport roller 6. The upper openings 111 are not necessary in this configuration of the installation and are therefore closed with dummy covers 112.

FIGS. 5 through 8 show the same vacuum coating installation as FIGS. 1 through 4, however, here a substrate 5 is moved through the two sections 2, 3 without any transport means 4. FIG. 7 shows a cross-section through the pump section 2 according to the intersection line C-C in FIG. 6. FIG. 8 shows a cross-section through the sputter section 3 according to the intersection line D-D in FIG. 6. The substrate 5 is clearly shorter in its vertical dimension than the transporting means 4 shown in FIGS. 1 through 4.

Different measures were taken to adjust the vacuum coating installation to this situation. For example it is discernible that a tunnel 21 adjusted to the size of the substrate 5 is arranged in the pump section 2, also having a shorter height. For the same reason, a counter sputter level 32 was provided in the sputter section 3, also adjusted. Furthermore, in this configuration of arrangements, the transport rollers 6 of the transport installation are arranged at the upper openings 111 in the rear wall. The openings 111 are positioned below them at a vertical distance therefrom in the rear wall 11, with the transport rollers 6 being arranged thereat in the illustrations of FIGS. 1 through 4 and now closed with dummy covers 112.

The substrate 5 stands with its bottom edge on the support wheels 63 of the transport rollers 6.

The invention claimed is:

1. A vertical vacuum coating installation for coating planar substrates oriented vertically or tilted from vertical, comprising a vacuum chamber and a transport device arranged in the vacuum chamber to transport the substrates along a transport path through the vacuum chamber, the transport device comprising a multitude of transport rollers arranged successively along the transport path, with each transport roller adapted to be mounted at least at two different positions, vertically distanced in reference to each other.

2. A vertical vacuum coating installation according to claim 1, wherein each transport roller comprises a spacer, with a support wheel being rotationally supported at one end of the spacer and with an other end of the spacer being adapted to be fastened at a vertical surface such that the support wheel is held at a distance from the surface.

3. A vertical vacuum coating installation according to claim 2, wherein the spacer comprises a shaft housing in which a shaft is rotationally supported, at least at one end of the shaft projecting from the shaft housing, and with the support wheel being arranged on an end of the shaft projecting from the shaft housing.

4. A vertical vacuum coating installation according to claim 3, wherein the shaft also projects from the shaft housing at a second end of the shaft opposite the support wheel and a drive wheel is arranged at said second end of the shaft.

5. A vertical vacuum coating installation according to claim 4, wherein a circumferential surface of the drive wheel is adapted to cooperate with a tension means.

6. A vertical vacuum coating installation according to claim 5, wherein the circumferential surface of the drive wheel is adapted for cooperating with a toothed belt.

7. A vertical vacuum coating installation according to claim 2, wherein the spacer comprises a base, provided with a stub shaft at least at one end, and with the support wheel supported rotationally on the stub shaft.

8. A vertical vacuum coating installation according to claim 2, wherein the spacer is provided with a circular flange at the other end opposite the support wheel.

9. A vertical vacuum coating installation according to claim 5, wherein the circumferential surface of the support wheel has a friction-enhancing surface.

10. A vertical vacuum coating installation according to claim 9, wherein the friction-enhancing surface comprises a roughened surface.

11. A vertical vacuum coating installation according to claim 1, wherein at least some of the transport rollers are adapted to be driven and further comprising a drive device for driving said at least some of the transport rollers, said drive device being arranged outside the vacuum chamber.

12. A vertical vacuum coating installation according to claim 3, wherein openings are provided in a wall of the vacuum chamber to fasten the transport rollers such that an end of the shaft opposite the support wheel projects from the vacuum chamber.

13. A vertical vacuum coating installation according to claim 12, wherein dummy covers are provided to close openings not needed.

14. A vertical vacuum coating installation according to claim 1, further comprising a transport carrier for a planar substrate, of said planar substrates, comprising a carrier frame and accepting means arranged at the carrier frame for receiving the substrate as well as a guiding rod arranged at a bottom of the carrier frame in a direction of transportation to create a friction connection with the transport rollers of the transport device at connection points, with the guiding rod being connected to the carrier frame at least at one connection point such that a relative displacement of the guiding rod relative to the carrier frame is possible in the direction of transportation.

15. A transporting means vertical vacuum coating installation according to claim 14, wherein, at least at one side of the carrier frame, a part of the guiding rod projects beyond an exterior connection point to the carrier frame and the projecting part of the guiding rod tapers towards an end of the rod.

16. A vertical vacuum coating installation according to claim 14, wherein the accepting means are arranged at the carrier frame with position of the accepting means being variable to adjust to differently sized substrates.

* * * * *

UNITED STATES PATENT AND TRADEMARK OFFICE
CERTIFICATE OF CORRECTION

| | | |
|---|---|---|
| PATENT NO. | : 8,092,607 B2 | |
| APPLICATION NO. | : 12/262434 | |
| DATED | : January 10, 2012 | |
| INVENTOR(S) | : Pollack et al. | |

It is certified that error appears in the above-identified patent and that said Letters Patent is hereby corrected as shown below:

Column 6, Line 32 Claim 15, Delete "transporting means"

Signed and Sealed this
Twenty-seventh Day of March, 2012

David J. Kappos
*Director of the United States Patent and Trademark Office*